United States Patent [19]
Chen

[11] Patent Number: 6,005,807
[45] Date of Patent: Dec. 21, 1999

[54] METHOD AND APPARATUS FOR SELF-ALIGNED MEMORY CELLS AND ARRAY USING SOURCE SIDE INJECTION

[75] Inventor: Bin-Shing Chen, Da-Hseuh, Taiwan

[73] Assignee: Winbond Electronics Corp., Hsin-Chu, Taiwan

[21] Appl. No.: 09/153,948

[22] Filed: Sep. 16, 1998

[51] Int. Cl.$^6$ .................................................. G11C 16/04
[52] U.S. Cl. .............................. 365/185.26; 365/185.01; 365/185.27
[58] Field of Search ...................... 257/316, 324, 257/315; 437/43; 365/185.12, 185.26, 185.28, 185.01, 185.27, 185.3, 56

[56] References Cited

U.S. PATENT DOCUMENTS

| | | | |
|---|---|---|---|
| 5,705,416 | 1/1998 | Kim et al. | 437/43 |
| 5,753,953 | 5/1998 | Fukumoto | 257/316 |
| 5,789,297 | 8/1998 | Wang et al. | 438/267 |

*Primary Examiner*—David Nelms
*Assistant Examiner*—Thong Le
*Attorney, Agent, or Firm*—Claude A.S. Hamrick; Justin Boyce; Oppenheimer Wolff & Donnelly LLP

[57] ABSTRACT

A method for fabricating a split gate memory cell using the self-alignment technique to reduce the amount of misalignment is disclosed. The memory cell generally comprises a floating gate for storing a charge, a select gate for selecting one or more memory cell to operate thereon, a control gate, a buried source region and a buried drain region. Due to the structure of the memory cell, there is no read disturbance when reading the memory cell and its low voltage requirement makes it suitable for low voltage applications. When placed in a memory array, each of the memory cells in the array can be individually programmed or read. In performing the erase operation, a column of information is erased.

8 Claims, 5 Drawing Sheets

METHOD AND APPARATUS FOR SELF-ALIGNED MEMORY CELLS AND ARRAY USING SOURCE SIDE INJECTION

FIELD OF THE INVENTION

The present invention generally relates to flash memory cells and arrays, and, in particular, to flash EPROM cells and arrays.

BACKGROUND OF THE INVENTION

A major concern of memory cells having a split gate (or stacked gate) structure arranged in a memory array is with the over-erase problem when operating a particular memory cell or cells in the memory array. Memory cells having the split gate structure arranged in a memory array avoids the over-erase problem by adding select gate (SG) and control gate (CG) in series with the floating gate (FG). However, it is difficult to scale down the split gate structure using prior art technology because in the prior art, the select gate and the control gate is not self-aligned to the floating gate. Consequently, the cell size of the split gate structure is generally larger than the stacked gate structure in order to provide for problems associated with misalignment of the gates. Furthermore, misalignment of the respective drain and source regions of adjacent memory cells also cause program mismatch and sub-threshold disturbance.

It would be desirable to have a method for manufacturing memory cells arranged in a memory array that is scaleable, can be fabricated using self alignment techniques, and have a resulting memory array that requires low current for programming the memory cells.

SUMMARY OF THE INVENTION

It is an object of the present invention to provide a method for fabricating memory cells for a memory array using a self alignment technique to reduce misalignment and to allow scaling of the device.

It is another object of the present invention to provide a method for fabricating memory cells for a memory array having select gates for selecting one or more memory cells for program or read operations.

It is still another object of the present invention to provide a method for fabricating memory cells for a memory array requiring only low current for source side injection in programming the memory cells.

Briefly, a presently preferred embodiment of the present invention provides for a method for fabricating a split gate memory cell using the self-alignment technique to reduce the amount of misalignment. The memory cell generally comprises a floating gate for storing a charge, a select gate for selecting one or more memory cell to operate thereon, a control gate, a buried source region and a buried drain region. Due to the structure of the memory cell, there is no read disturbance when reading the memory cell and its low voltage requirement makes it suitable for low voltage applications. When placed in a memory array, each of the memory cells in the array can be individually programmed or read. In performing the erase operation, a column of information is erased.

An advantage of the present invention is that it provides a method for fabricating memory cells for a memory array using a self alignment technique to allow scaling of the device.

Another advantage of the present invention is that it provides a method for fabricating memory cells for a memory array having select gates for selecting one or more memory cells for program or read operations.

Still another advantage of the present invention is that it provides a method for fabricating memory cells for a memory array requiring only low current for source side injection in programming the memory cells.

These and other features and advantages of the present invention will become well understood upon examining the figures and reading the following detailed description of the invention.

DRAWINGS

FIGS. 2a–2l illustrate the structure of the memory cell of the presently preferred embodiment during the various processing steps.

DETAILED DESCRIPTION OF THE PREFERRED EMBODIMENTS

Figure 1:
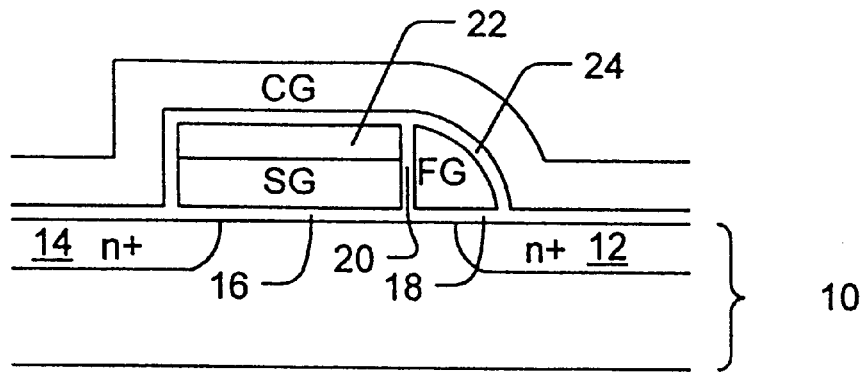
FIG. 1 illustrates the structure for a memory cell of a presently preferred embodiment of the present invention.

FIG. 1 illustrates the structure of a memory cell of the presently preferred embodiment of the present invention. The memory cell is laid out on a substrate 10 where one area is doped as a source region 12 and another area is doped as a drain region 14. Both of the regions are fabricated as buried n+regions where only one contact to each column of memory cells is necessary since memory cells in the same columns share common drain lines and source lines. The substrate is separated from the select gate (SG) and the floating gate (FG) by an insulation layer. As indicated at 16, the insulation layer between the substrate and the select gate can be fabricated from oxide, nitride, oxide/nitride composite film, or other material. The thickness of this layer can be in the range from 30–300 Å. The insulation layer 18 between the floating gate and substrate is a tunnel oxide layer having a thickness in the range from 30–200 Å. Between the floating gate and the select gate is another insulation layer 20 where this dielectric layer again can be made from oxide, nitride, oxide/nitride composite or other insulation material. Above the select gate (SG) is a dielectric layer 22 which can be fabricated from insulation material described above. By adjusting the thickness of this dielectric layer, the height of the floating gate is adjusted as well. An interpoly dielectric layer 24 covers part of the substrate 10, the dielectric layer 22 and the floating gate and can be fabricated by similar insulation material described above. Finally, the control gate (CG) made from polysilicon material (poly-Si, a-Si, recrystalized silicon, polycide, or other material) is placed over the entire structure.

The fabrication for the memory cell and array of the preferred embodiment comprises several steps. Although the sequential steps are described as follows, it shall be understood that there are other steps for fabrication of the cells including doping of the n-well(s) and p-well(s) in either twin well or triple well structure and growth of field oxide (FOX). Only the most essential steps are described here for the presently preferred embodiment of the present invention. Furthermore, deposition described herein is to be understood as to include all conventional deposition methods and similar techniques such as thermal growth.

Figure 2A:
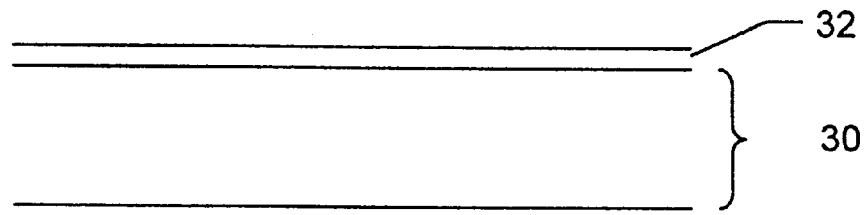
Figure 2B:
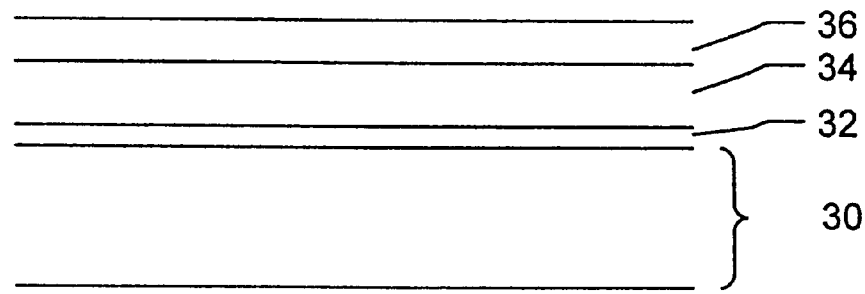
Figure 2C:
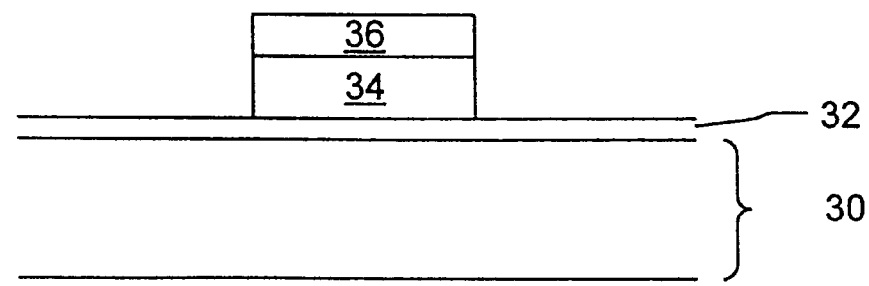
Figure 2D:
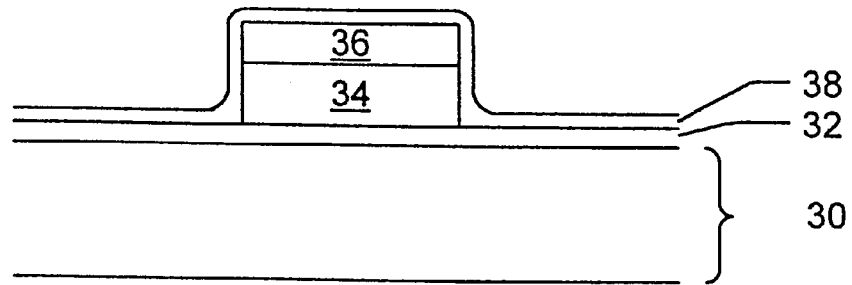
Figure 2E:
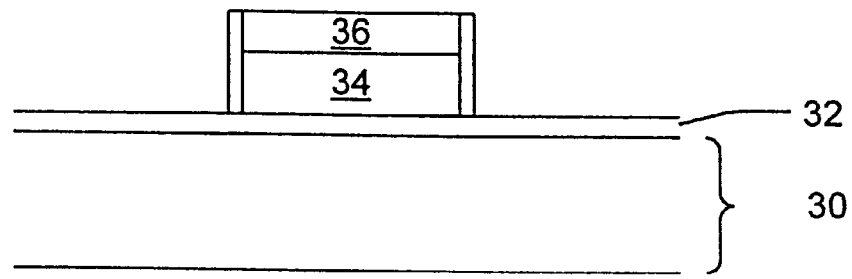
Figure 2F:
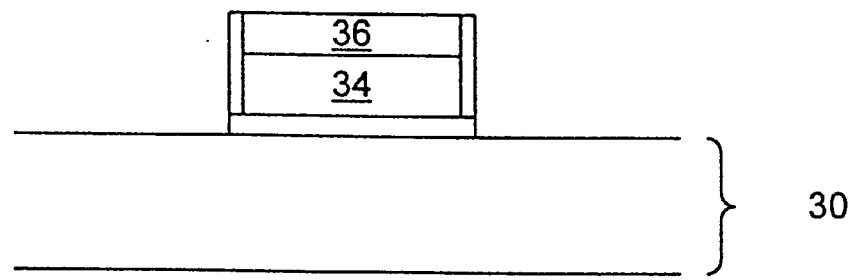
Figure 2G:
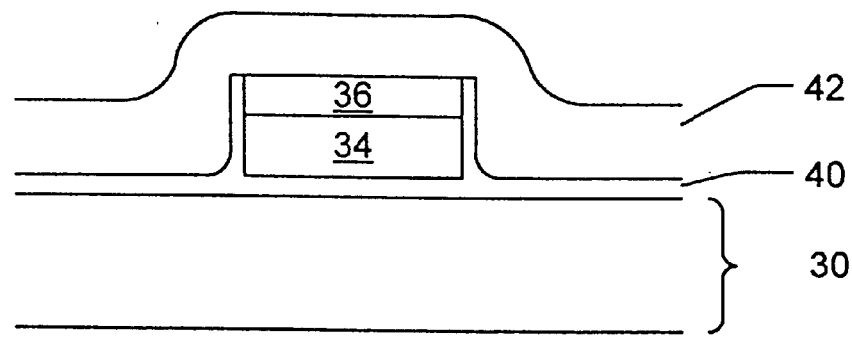

In a first step, referring to FIG. 2a, an insulation layer —oxide layer 32 is grown on the substrate 30. In the next step, referring to FIG. 2b, a first polysilicon layer (poly-1) 34 is deposited (and doped) on the oxide layer 32 followed by deposition of a dielectric layer 36 on top of the polysilicon layer 34. Then, as shown by FIG. 2c, the first polysilicon layer 34 and the dielectric layer 36 are patterned into stripes. Next, referring to FIG. 2d, a second dielectric layer is deposited (or grown) over the structure to define the side wall dielectric 38. Referring to FIG. 2e, an anisotropic dry etching step is performed on the second dielectric layer to remove the layer from the top, and in the next step, referring to FIG. 2f, the oxide on top of the substrate is removed to bare the substrate. As is illustrated by FIG. 2g, a tunnel oxide layer is grown (as indicated at 40). A second layer of polysilicon (poly-2) 42 is deposited over the structure and doped appropriately as well.

Figure 2H:
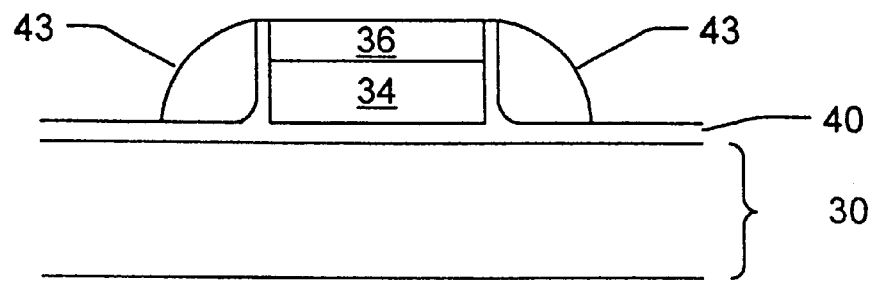
Figure 2I:
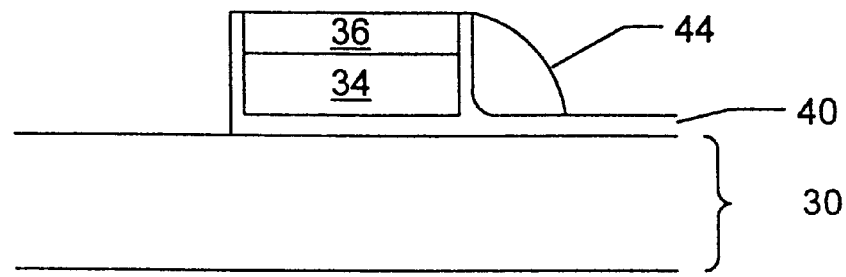
Figure 2J:
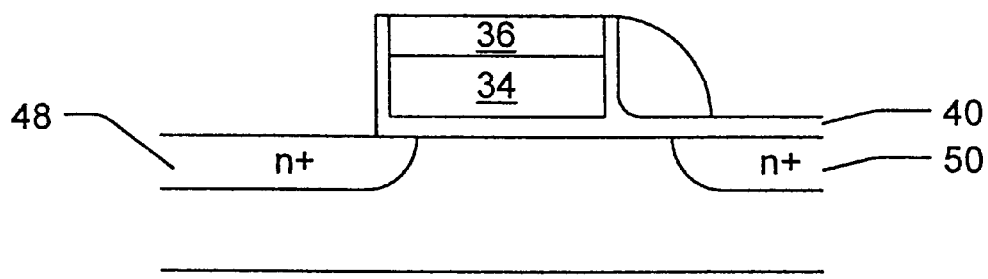
Figure 2K:
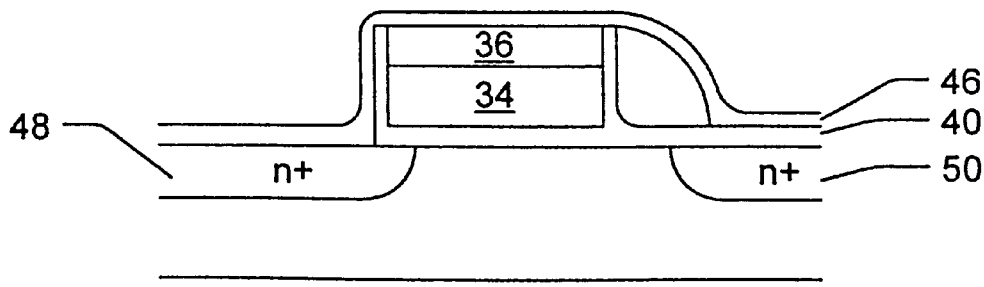
Figure 2I:
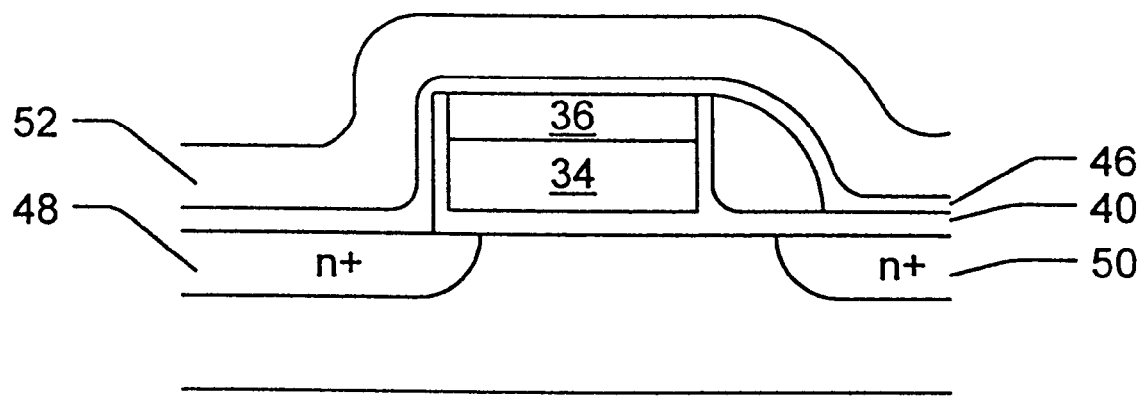

In forming the floating gate, referring the FIG. 2h, an etching step is performed to shape poly-2 into the desired shape 43 for the floating gate. In the next step, as illustrated by FIG. 2i, one of the two spacer is removed and the remaining spacer is used as the floating gate 44. The shape and size of the floating gate 44 is determined by the height of the dielectric layer 36 and the amount of poly-2 deposited. After the floating gate 44 is made, referring to FIG. 2j, the drain and source regions, 48 and 50, are formed where their profiles and doping levels can be varied as desired and the implant method of choice can be selected as well. Although this configuration is shown as illustrated, the drain and source regions can be designated as desired. As is illustrated by FIG. 2k, a dielectric layer 46 is deposited over the structure, noting that this step can be performed before the implantation of the source and drain regions. The dielectric layer can be oxide nitride, oxide nitrate or other composite layer. Finally, referring to FIG. 2l, a third layer of polysilicon is deposited over the structure, doped, and patterned as the control gate 52.

Figure 3:
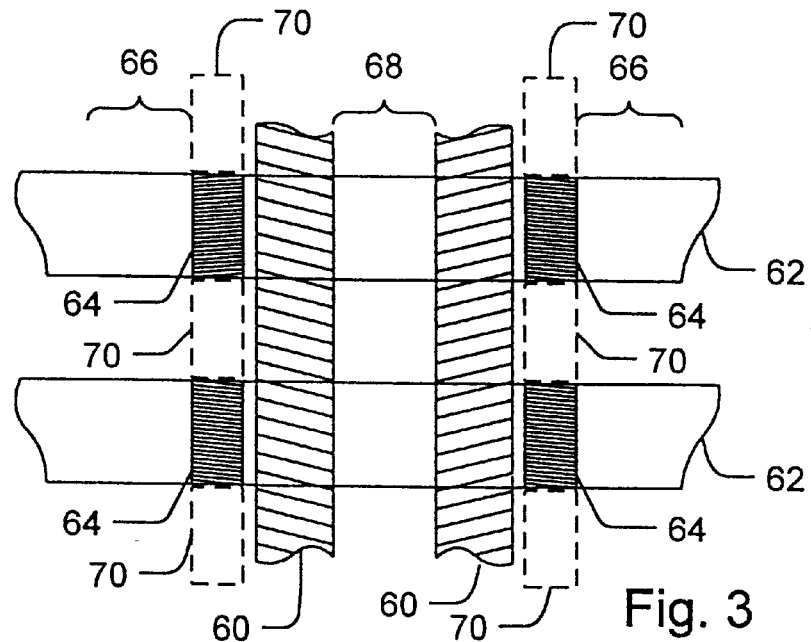
FIG. 3 illustrates a top view of the memory array of the preferred embodiment of the present invention.

FIG. 3 illustrates a top view of the layout of the structure. There are stripes of the select gates 60 and the control gates 62. Next to the select gates are floating gates 64. Adjacent to each floating gate is a buried source region 66 and in between every other two select gates is a buried drain region 68. Furthermore, field oxide (FOX) is shown as indicated at 70.

In operating the memory cell of the preferred embodiment, Table 1 lists the operating voltages for each respective terminal for performing the desired operations.

TABLE 1

| Operation Electrode | Program | Source Side Erase (for p-well) | Channel Erase (shallow p-well in deep n-well) | Read |
| --- | --- | --- | --- | --- |
| Vs  | 5 V  | 5 V   | 9 V      | 0 V |
| Vsg | 2 V  | 0 V   | 0 V      | 2 V |
| Vcg | 12 V | −12 V | −9 V     | 5 V |
| Vb  | GND  | 0 V   | 9 V      | 0 V |
| Vd  | ~0 V | floating | floating | 4 V |

In performing the program operation, Vs (source) is set to about 5 V, Vsg (select gate) is set to about 2 V, Vcg (control gate) is set to about 12 V, Vb (body) is set to ground, and Vd (drain) is set to about 0 V. Given the structure of the memory cell, the program current can be lower than that of a stacked gate structure due to better injection efficiency. Thus, this type of cell is suitable for low Vcc applications. In performing the erase operation, it depends on the fabrication of the memory cell. If the cell in placed in a simple p-well. Vs is set to about 5 V. Vd is floating, Vsg is at about 0 V, Vcg is set to about −12 V, and Vb is at about 0 V. If the cell is placed in a p-well and the p-well is in a deep n-well in a triple well set-up, Vs is set to about 9 V, Vd is floating, Vsg is at about 0 V, Vcg is at about −9 V and Vb is at about −9 V. In the read operation, Vs is at about 0 V, Vd is at about 4 V, Vsg is at about 2 V, Vcg is at about 5 V, and Vb is at about 0 V. In the read operation, there is no read disturbance because the current goes from the source region to the drain region rather than from the drain region to the source region so that electron cannot go to the floating gate via the tunnel oxide.

Figure 4:
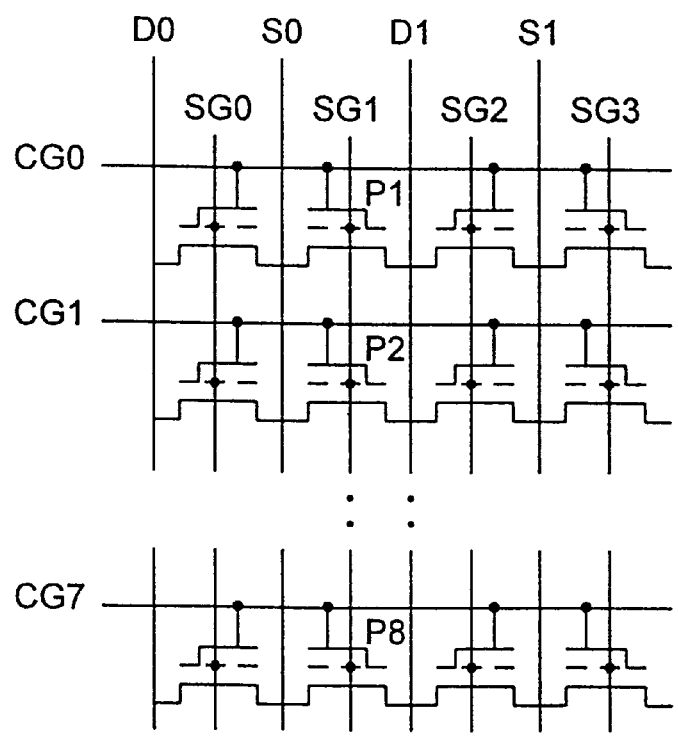
FIG. 4 illustrates a memory array circuit of the preferred embodiment of the present invention.

In operating a particular memory cell in a memory array, Table 2 illustrates the recommended voltage levels for accessing a particular memory cell in a memory array illustrated in FIG. 4.

TABLE 2

| Operation Electrode | Program P1 | Erase P1–P8 | Read P1 |
| --- | --- | --- | --- |
| CG0 | 12 V | −12 V | 5 V |
| CG1 | 0 V  | 0 V   | 0 V |
| D0  | 0 V  | F     | 5 V |
| D1  | 5 V  | F     | 0 V |
| S0  | 5 V  | 5 V   | 0 V |
| S1  | 0 V  | F     | 0 V |
| SG0 | 2 V  | 0 V   | 5 V |
| SG1 | 0 V  | 0 V   | 0 V |
| SG2 | 0 V  | 0 V   | 0 V |
| SG3 | 0 V  | 0 V   | 0 V |

As is shown by Table 2, in operating a memory cell P1 in the memory array illustrated in FIG. 4, for the respective program, erase, and read operations, the recommended voltage levels are listed. In the erase operation, typically a column is erased at a time.

Although the present invention has been described in terms of specific embodiments it is anticipated that alterations and modifications thereof will no doubt become apparent to those skilled in the art. It is therefore intended that the following claims be interpreted as covering all such alterations and modifications as fall within the true spirit and scope of the invention.

I claim:

1. A method for fabricating a selectable transistor, comprising the steps of
    a) providing a substrate;
    b) defining a channel region within said substrate;
    c) providing a first insulating layer over said substrate;
    d) defining a select gate generally placed over said channel region;
    e) providing a second insulating layer;
    f) defining a floating gate generally placed on one side of said select gate;
    g) implanting a drain region and a source region using said select gate and floating gate as a mask;
    h) providing a third insulating layer; and
    i) defining a control gate over said floating gate and said select gate.

2. A method as recited in claim 5 wherein said step of defining said select gate includes the substeps of:
    1) depositing a first polysilicon layer over said first insulating layer;
    2) depositing a dielectric layer over said first polysilicon layer; and
    3) patterning said fist polysilicon layer and said dielectric layer, leaving portions of said first polysilicon layer and said first dielectric layer remaining, and exposing a portion of said first insulating layer.

3. A method as recited in claim 2 wherein said first polysilicon layer is doped.

4. A method as recited in claim 1 wherein said step of defining said floating gate includes the substeps of:
   1) depositing a second polysilicon layer over said dielectric layer;
   2) etching said second polysilicon layer to form a spacer on each side of said select gate; and
   3) removing one of said spacers and leaving a remaining spacer forming said floating gate.

5. A method as recited in claim 1 wherein said step for defining said control gate includes the substeps of:
   1) depositing a third polysilicon layer over said floating gate and said select gate; and
   2) patterning and etching said third polysilicon layer to form said control gate.

6. A method as recited in claim 5 wherein said third polysilicon layer is doped.

7. A method as recited in claim 2 wherein said dielectric layer has a predetermined height for forming the corresponding floating gates having said predetermined height.

8. A method for fabricating a selectable transistor, comprising the steps of:
   a) providing a substrate;
   b) defining a channel region within said substrate;
   c) providing a first insulating layer over said substrate;
   d) defining a select gate generally placed over said channel region by,
      depositing a first polysilicon layer over said first insulating layer,
      depositing a first dielectric layer over said first polysilicon layer, and
      patterning said first polysilicon layer and said dielectric layer, leaving portions of said first polysilicon layer and said first dielectric layer remaining, and exposing a portion of said first insulating layer;
   e) depositing a second insulating layer over said remaining portions of said first polysilicon layer and said first dielectric layer, and over said first insulating layer;
   f) defining a floating gate generally placed on one side of said select gate by,
      depositing a second polysilicon layer over said dielectric layer;
      etching said second polysilicon layer to form a spacer on each side of said select gate; and
      patterning and etching to remove one of said spacers to leave a remaining spacer forming said floating gate;
   g) implanting a drain region and a source region using said select gate and floating gate as masking;
   h) depositing a third insulating layer over said select gate and said floating gate; and
   i) defining a control gate over said floating gate and said select gate by depositing a third polysilicon layer over said floating gate and said select gate, and patterning and etching said third polysilicon layer to form said control gate.

* * * * *